United States Patent
Cao et al.

(10) Patent No.: US 11,620,848 B2
(45) Date of Patent: Apr. 4, 2023

(54) DETECTION CIRCUIT, SKIN PRINT RECOGNITION DEVICE AND DRIVING METHOD

(71) Applicant: BOE TECHNOLOGY GROUP CO., LTD., Beijing (CN)

(72) Inventors: Xueyou Cao, Beijing (CN); Pengpeng Wang, Beijing (CN); Xiaoliang Ding, Beijing (CN); Haisheng Wang, Beijing (CN); Ping Zhang, Beijing (CN); Wenjuan Wang, Beijing (CN); Yapeng Li, Beijing (CN); Jiabin Wang, Beijing (CN); Likai Deng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 251 days.

(21) Appl. No.: 16/762,349

(22) PCT Filed: Nov. 1, 2019

(86) PCT No.: PCT/CN2019/115133
§ 371 (c)(1),
(2) Date: May 7, 2020

(87) PCT Pub. No.: WO2020/140601
PCT Pub. Date: Jul. 9, 2020

(65) Prior Publication Data
US 2021/0209326 A1 Jul. 8, 2021

(30) Foreign Application Priority Data
Jan. 2, 2019 (CN) .......................... 201910002438.6

(51) Int. Cl.
*H03K 17/96* (2006.01)
*G06V 40/13* (2022.01)
*G01J 1/44* (2006.01)

(52) U.S. Cl.
CPC ............ *G06V 40/1318* (2022.01); *G01J 1/44* (2013.01); *H03K 17/9627* (2013.01); *G01J 2001/446* (2013.01)

(58) Field of Classification Search
CPC .. G06V 40/1318; G01J 1/44; G01J 2001/446; H03K 17/9627; G06F 3/0304; G06F 3/042
See application file for complete search history.

(56) References Cited

U.S. PATENT DOCUMENTS 9,972,655 B2 *   5/2018  Kurokawa ........... A61B 6/4208
2004/0198463 A1 * 10/2004  Knoedgen ............. H04M 1/605
                                                      455/41.1

(Continued)

FOREIGN PATENT DOCUMENTS

CN          106412464 A      2/2017
CN          107342744 A     11/2017

(Continued)

OTHER PUBLICATIONS

Chinese Office Action in Chinese Application No. 201910002438.6 dated Sep. 1, 2021 with English translation.

(Continued)

*Primary Examiner* — Antonio Xavier
(74) *Attorney, Agent, or Firm* — Collard & Roe, P.C.

(57) ABSTRACT

A detection circuit, a skin print recognition device and a method for driving a detection circuit are disclosed. The detection circuit includes a photosensitive element, a switching sub-circuit and a charge releasing sub-circuit. The photosensitive element is electrically coupled to the switching sub-circuit and the charge releasing sub-circuit, and is configured to convert a received optical signal into an electrical signal, the switching sub-circuit is configured to output the electrical signal, and the charge releasing sub-circuit is configured to release charges in the photosensitive (Continued)

element after the switching sub-circuit outputs the electrical signal.

14 Claims, 9 Drawing Sheets

(56) References Cited

U.S. PATENT DOCUMENTS

| | | | | |
|---|---|---|---|---|
| 2008/0018612 A1* | 1/2008 | Nakamura | ............ | G06F 3/0354 345/173 |
| 2009/0273580 A1* | 11/2009 | Ota | ............ | G06F 3/042 345/175 |
| 2012/0002149 A1* | 1/2012 | Katoh | ............ | G06F 3/042 250/208.2 |
| 2012/0091321 A1* | 4/2012 | Tanaka | ............ | G06F 3/042 250/208.2 |
| 2014/0117214 A1* | 5/2014 | Mellot | ............ | G01J 1/4204 250/2 UAL |
| 2015/0028335 A1* | 1/2015 | Kurokawa | ............ | A61B 6/4208 257/43 |
| 2018/0249109 A1* | 8/2018 | Yang | ............ | H04N 5/378 |
| 2018/0300527 A1* | 10/2018 | Wang | ............ | G06F 3/0421 |
| 2019/0087626 A1* | 3/2019 | Wang | ............ | G06F 3/042 |
| 2019/0237591 A1* | 8/2019 | Cheng | ............ | H01L 31/10 |
| 2020/0193129 A1* | 6/2020 | Chen | ............ | G06V 10/141 |

FOREIGN PATENT DOCUMENTS

| | | |
|---|---|---|
| CN | 207123500 U | 3/2018 |
| CN | 108168695 A | 6/2018 |

OTHER PUBLICATIONS

International Search Report of PCT/CN2019/115133 in Chinese, dated Jan. 21, 2020, with English translation.

* cited by examiner

DETECTION CIRCUIT, SKIN PRINT RECOGNITION DEVICE AND DRIVING METHOD

CROSS REFERENCE TO RELATED APPLICATIONS

This application is the National Stage of PCT/CN2019/115133 filed on Nov. 1, 2019, which claims priority under 35 U.S.C. § 119 of Chinese Application No. 201910002438.6 filed on Jan. 2, 2019, the disclosure of which is incorporated by reference.

TECHNICAL FIELD

The present disclosure relates to a detection circuit, a skin print recognition device and a method for driving a detection circuit.

BACKGROUND

With the increasing use of mobile terminals, more and more users use mobile terminals for authentication, electronic payment and other operations. Due to the uniqueness of a skin print such as a fingerprint pattern or a palm print pattern, the fingerprint recognition technology combined with optical imaging is gradually adopted by mobile electronic devices for authentication, electronic payment, and the like. How to improve the accuracy of fingerprint recognition is a focus issue in the field.

SUMMARY

At least one embodiment of the present disclosure provides a detection circuit, which includes a photosensitive element, a switching sub-circuit and a charge releasing sub-circuit. The photosensitive element is electrically coupled to the switching sub-circuit and the charge releasing sub-circuit, and is configured to convert a received optical signal into an electrical signal, the switching sub-circuit is configured to output the electrical signal, and the charge releasing sub-circuit is configured to release a charge in the photosensitive element after the switching sub-circuit outputs the electrical signal.

At least one embodiment of the present disclosure provides a skin print recognition device, which includes a display panel and a plurality of detection circuits described in the embodiments of the present disclosure provided on a side of the display panel. The display panel includes a plurality of pixel units, and the detection circuit is configured to receive light emitted by the plurality of pixel units and reflected by a skin print touching the display panel.

At least one embodiment of the present disclosure provides a method for driving a detection circuit, which includes a detection period and a charge releasing period after the detection period. In the detection period, the photosensitive element converts the received optical signal into the electrical signal, and the switching sub-circuit outputs the electrical signal, and in the charge releasing period, the charge releasing sub-circuit releases the charges in the photosensitive element after the electrical signal is output.

At least one embodiment of the present disclosure provides a method for driving a detection circuit, which includes a detection period and a charge releasing period after the detection period. In the detection period, the photosensitive element converts the received optical signal into the electrical signal, and the switching sub-circuit outputs the electrical signal, and in the charge releasing period, the charge releasing sub-circuit causes the potential of the anode electrode to be greater than or equal to the potential of the cathode electrode after the electrical signal is output, so as to release the charges in the photosensitive element.

At least one embodiment of the present disclosure provides a method for driving a detection circuit, which includes a detection period and a charge releasing period after the detection period. In the detection period, the photosensitive element converts the received optical signal into the electrical signal, and the switching sub-circuit outputs the electrical signal, and in the charge releasing period, the charge releasing sub-circuit electrically connects the anode electrode and the cathode electrode after the electrical signal is output, so as to release the charges in the photosensitive element.

BRIEF DESCRIPTION OF THE DRAWINGS

In order to more clearly illustrate the technical schemes of the embodiments of the present disclosure, the drawings of the embodiments will be briefly described in the following. It is obvious that the described drawings below are only related to some embodiments of the disclosure and are not limitative to the disclosure.

DETAILED DESCRIPTION

In order to make the objects, technical schemes and advantages of the embodiments of the present disclosure clear, the technical solutions of the embodiments of the present disclosure will be described in a clear and full way in connection with the drawings of the embodiments of the present disclosure. Obviously, the described embodiments are some embodiments of the present disclosure, not all embodiments. Based on the described embodiments of the present disclosure, all other embodiments obtained by those of ordinary skill in the art without the use of inventive faculty are within the scope of the present disclosure.

Unless otherwise defined, all the technical and scientific terms used herein have the same meanings as commonly understood by those of ordinary skill in the art to which the present disclosure belongs. The terms "first," "second," etc., which are used in the present disclosure, are not intended to indicate any sequence, amount or importance, but used to distinguish various components. Similarly, similar words such as "a", "an" or "the" do not denote a limitation of quantity, but rather denote the presence of at least one. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

At present, the narrow frame display screen technology has gradually become a mainstream. One of the means to implement this technology is to integrate a detection circuit (for example, an image sensor) having a function of recognizing a fingerprint into a display screen so as to implement an under-screen fingerprint recognition manner, thus increasing the area of the effective display region of the display screen.

Figure 1A:
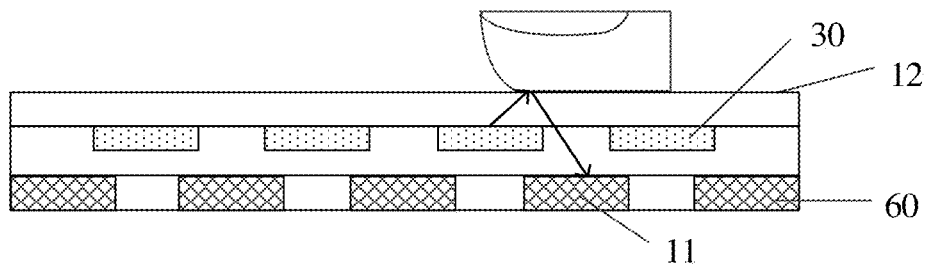
FIG. 1A is a schematic cross-sectional view of a skin print recognition device.
Figure 1B:
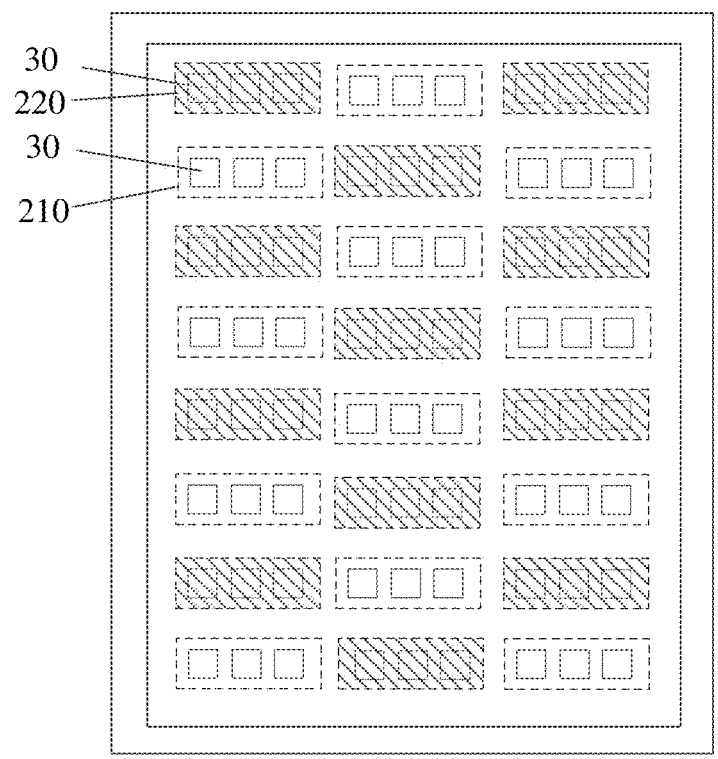
FIG. 1B is a schematic plan view corresponding to FIG. 1A.
Figure 1C:
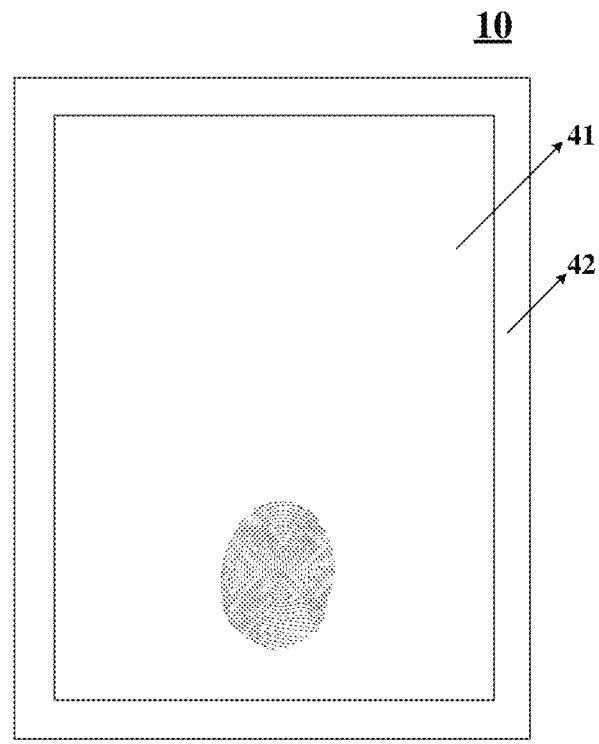
FIG. 1C is a schematic diagram of fingerprint recognition by a skin print recognition device.

FIG. 1A is a schematic cross-sectional view of a skin print recognition device 1, FIG. 1B is a schematic plan view of the skin print recognition device 1, and FIG. 1C is a schematic diagram of fingerprint recognition by the skin print recognition device 1.

As illustrated in FIGS. 1A and 1B, the skin print recognition device 1 has a touch side 12 (illustrated as an upper side of the skin print recognition device 1 in FIG. 1A), and includes a light source array and a detection circuit array 60. For example, the skin print recognition device 1 can be used for the acquisition of a skin print (e.g., a fingerprint or a palm print) for fingerprint or palm print recognition. The light source array includes a plurality of light sources 30 arranged in an array within a predetermined region. The detection circuit array 60 is provided on a side of the light source array, for example, provided on a side of the light source array away from the touch side. The detection circuit array 60 includes a plurality of detection circuits 11 arranged in an array within a predetermined region. The plurality of detection circuits 11 are configured to receive light emitted from the light sources 30 and reflected to the detection circuits 11 by a skin print for skin print acquisition. For example, the light reflected to the detection circuits 11 is the light reflected to the skin print recognition device 1 by an operation body having a skin print, such as a finger or palm of an operator. The plurality of detection circuits 11 synthesize a skin print pattern according to respective electrical signal generated by the light.

In some embodiments, the skin print recognition device 1 is implemented as a display device which includes a display array including a plurality of sub-pixels, and the display array is used to implement a light source array. For example, one or more sub-pixels are combined to implement one light source 30 that emits light for skin print acquisition. As illustrated in FIG. 1C, the display device includes a display region 41 and a peripheral region 42, and the detection circuit array 60 is provided corresponding to part or all of the display region 41 so that the part or all of the display region 41 has an under-screen fingerprint recognition function. For example, the display device is an organic light emitting diode (OLED) display device or a quantum dot light emitting diode (QLED) display device, and accordingly, subpixels of the display array are OLED subpixels or QLED subpixels. An operation method of the skin print recognition device 1 is described as follows. As illustrated in FIG. 1A, when an operation body having a skin print, such as a finger or palm of an operator, touches a touch side surface 12 of the skin print recognition device 1, the light emitted from the light source 30 can be reflected by the operation body, for example, the light reaches the detection circuit 11 through gaps between respective light sources 30 in the light source array, and the detection circuit 11 senses a received optical signal and outputs a detection signal, for example, the detection signal may be provided to a back end processor (e.g., an integrated circuit chip) for further processing, thereby obtaining a skin print image of the operation body.

For example, as illustrated in FIGS. 1A, 1B, and 1C, when an operation body having a skin print, such as a finger, touches the touch side surface 12 of the skin print recognition device 1, a touch area of the finger is generally larger than an area of the region occupied by one light source 30, thus, in general, it is required to perform detection many times for obtaining a complete skin print image (e.g., a fingerprint image).

During the skin print acquisition by the skin print recognition device 1, a portion of the light sources 30 are first turned on (i.e., emit light) for forming a light source pattern, and then the detection circuit array 60 performs detection for obtaining a partial skin print image. Then, another portion of light sources 30 shifted by a predetermined distance in a predetermined direction are turned on, that is, switching a light source pattern, and next, the detection circuit array 60 performs detection for obtaining another partial skin print image. In this way, after a plurality of cycles of detection, a plurality of partial skin print images can be obtained, and then a complete skin print image can be obtained by stitching the plurality of partial skin print images.

In the embodiments of the present disclosure, one cycle, which starts from the lighting of the portion of the light sources 30 and ends when the detection by the detection circuit described above is completed, is referred to as one frame, and this applies to the following embodiments and will not be repeated.

For example, as illustrated in FIG. 1B, three point light sources 30 are arranged to form a first pattern 210 (constituting a line light source), a plurality of first patterns 210 are spaced apart from each other and arranged in an array, and a second pattern 220 is arranged between the plurality of first patterns 210. Similar to the first pattern 210, the second pattern 220 is also formed by arranging three point light sources 30. For example, in a first frame, the point light sources 30 in the first pattern 210 can be turned on, then the detection circuit array 60 performs detection for obtaining a partial skin print image, and then the point light sources 30 in the first pattern 210 are turned off. Next, in a second frame, the point light sources 30 in the second pattern 220 can be turned on, then the detection circuit array 600 performs detection for obtaining a partial skin print image, and then the point light sources 30 in the second pattern 220 are turned off. Finally, two partial skin print images obtained in the two frames are stitched so that a complete skin print image is obtained, thereby completing skin print recognition.

It should be noted that FIG. 1B is only for the purpose of exemplarily illustrating a process of skin print recognition, and the embodiments of the present disclosure are not limited thereto. The selection and switching order of light source patterns may be set as required, and partial skin print images obtained in more than two frames can be stitched for obtaining a complete skin print image.

As described above, the operation body having a skin print may be a hand, and the skin print recognized by the detection circuit 11 is a skin print pattern, such as a fingerprint, palm print, etc. In addition, the operating body having a skin print may also be a non-living object having a certain surface print or texture, such as an object having a certain texture made of materials such as resin, and the embodiments of the present disclosure are not limited thereto.

In the detection circuit 11, in order to sense a received optical signal, a photosensitive element is usually provided in the detection circuit 11. For example, the photosensitive element may adopt a PN type or PIN type photodiode, and for example, the PN type or PIN type photodiode may be integrated in a display panel. When photosensitive materials in the photodiode are manufactured, if the surface is uneven, the formed photodiode may have defects, for example, electric charges generated due to induced light (called photo-generated charges) cannot be fully released out in a sufficiently short time period, thereby causing an afterimage problem. Especially in the technical schemes in which it is required to switch a plurality of light source images for stitching so as to implement optical skin print recognition, such as point light source schemes, line light source schemes, etc., this afterimage problem will be more serious. The afterimage problem is mainly due to the defects in the manufacturing process, which affect the capture and release of photo-generated carriers. For example, the carriers are not fully released during the detection of a current frame, causing the accumulation of charges, and the accumulated charges will be released during the detection of a next frame, thus causing afterimages.

Figure 2A:
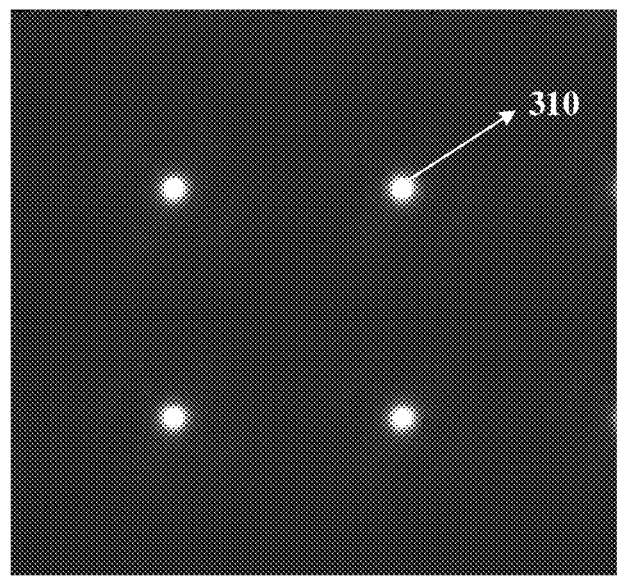
FIG. 2A is a schematic diagram of a point light source array.
Figure 2B:
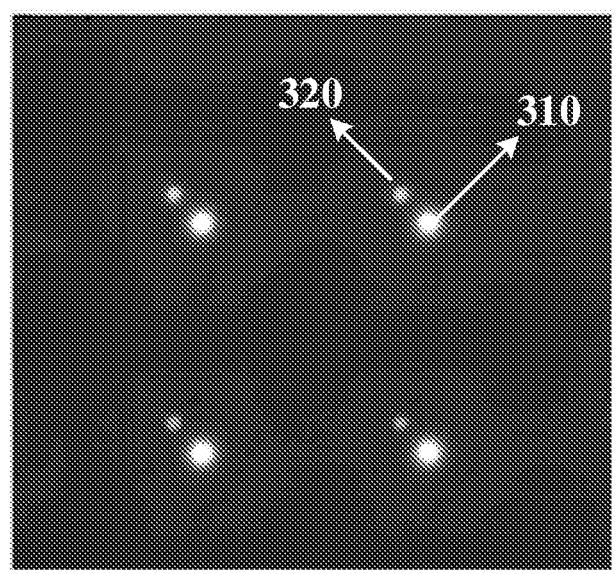
FIG. 2B is a schematic diagram of afterimages occurring upon switching a point light source array.

FIGS. 2A and 2B respectively illustrate two light source pictures in detection for two frames. FIG. 2A illustrates images 310 of four lighted point light sources 30. For example, in a first frame, the four point light sources 30 are turned on, then the detection circuit array performs the detection, and then the process advances to a second frame after the detection is completed. For example, as illustrated in FIG. 2B, the brighter four points in FIG. 2B correspond to images 310 of four light sources 30 which should be lighted in the second frame, and the remaining darker four points in FIG. 2B are afterimages 320 corresponding to the images 310 in the first frame. That is, the detection circuit used for forming the images of the four lighted point light sources in the first frame, because the photo-generated charges in the photosensitive element in the detection circuit are not fully released after the first frame and are accumulated to the second frame, a weakened image (compared with the first frame) is output in the second frame at a position where the image should not have been output, thereby causing afterimages. These afterimages affect the accuracy of skin print recognition.

Some embodiments of the present disclosure provide a detection circuit, which includes a photosensitive element, a switching sub-circuit and a charge releasing sub-circuit. The photosensitive element is electrically coupled to the switching sub-circuit and the charge releasing sub-circuit and is configured to convert a received optical signal into an electrical signal, the switching sub-circuit is configured to output the electrical signal, and the charge releasing sub-circuit is configured to release charges in the photosensitive element after the switching sub-circuit outputs the electrical signal. Some embodiments of the present disclosure also provide a skin print recognition device and a method for driving the above detection circuit.

The detection circuit, skin print recognition device and method provided by some embodiments of the present disclosure can avoid the afterimage problem by releasing the charges accumulated in the photosensitive element after the electrical signal is output in each frame, such as photo-generated charges, thereby improving the accuracy of skin print recognition.

The embodiments of the present disclosure will be described in detail below with reference to the accompanying drawings.

Figure 3:
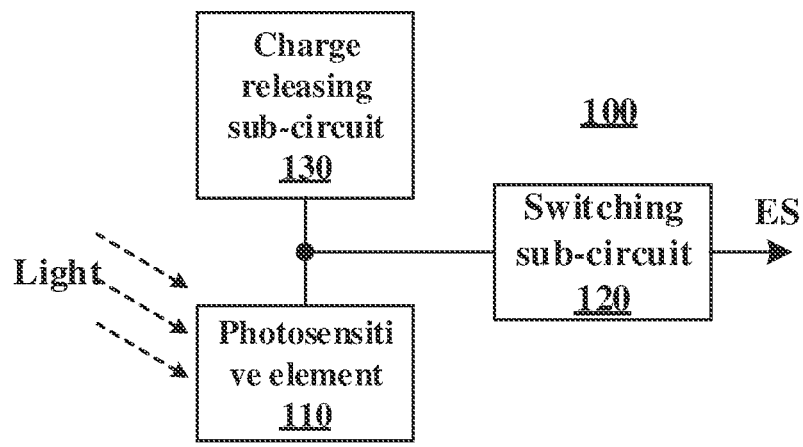
FIG. 3 is a schematic diagram of a detection circuit provided by some embodiments of the present disclosure.

Some embodiments of the present disclosure provide a detection circuit 100, as illustrated in FIG. 3. The detection circuit 100 includes a photosensitive element 110, a switching sub-circuit 120, and a charge releasing sub-circuit 130.

For example, the photosensitive element 110 is electrically coupled to the switching sub-circuit 120 and the charge releasing sub-circuit 130, and is configured to convert a received optical signal into an electrical signal ES. For example, the detection circuit 100 can be used in a skin print recognition device. During the skin print recognition process, the light emitted by light sources reaches the detection circuit 100 after being reflected by the skin print, the photosensitive element 110 in the detection circuit 100 can sense the received light, that is, convert the received optical signal into an electrical signal ES. For example, the electrical signal ES may be an electronic current signal. For example, the electrical signal ES may be transmitted to other circuits for further processing so as to obtain a skin print image. For example, the photosensitive element 110 can perform the above optical-electrical conversion during an optical-electrical conversion sub-period of one frame. The optical-electrical conversion sub-period will be described herein below and will not be repeated here.

For example, the photosensitive element 110 may adopt a photodiode, for example, the photodiode is a PN type or PIN type photodiode, and the semiconductor material used may be silicon, germanium, selenium, gallium arsenide, etc. The embodiments of the present disclosure are not limited to specific examples of the photosensitive element 110, as long as it is an element capable of converting the received optical signal into the electrical signal ES as described above.

For example, the switching sub-circuit 120 is configured to output the electrical signal ES. For example, the switching sub-circuit 120 is configured to receive a second control signal G2, and in the case where the switching sub-circuit 120 is turned on under the control of the second control signal G2, the electrical signal ES output by the photosensitive element 110 may be output. For example, the switching sub-circuit 120 may be turned on during an output sub-period of one frame. The output sub-period will be described herein below and will not be repeated here.

For example, the charge releasing sub-circuit 130 is configured to release charges of the photosensitive element 110, such as photo-generated charges, after the switching sub-circuit 120 outputs the electrical signal ES. For example, during the output sub-period of one frame, the photo-generated charges in the photo-sensitive element 110 may not be fully output, i.e. not fully released, and after the output sub-period is completed, the photo-generated charges may still remain in the photo-sensitive element 110, and these photo-generated charges may accumulate in the photo-sensitive element 110, thus affecting the detection of the next frame. Therefore, it is necessary to release the photo-generated charges remaining in the photo-sensitive element 110 before the start of the next frame. For example, during a charge releasing period of one frame, the charge releasing sub-circuit 130 can release the photo-generated charges remaining in the photosensitive element 110. The charge releasing period will be described herein below and will not be repeated here.

The detection circuit 100 provided by some embodiments of the present disclosure can release the photo-generated charges still remaining in the photosensitive element 110 after the photosensitive element 110 outputs the electrical signal ES by providing the charge releasing sub-circuit 130, so that the afterimage problem may be avoided, thus improving the accuracy of the skin print recognition of the skin print recognition device using the detection circuit 100.

It should be noted that in the embodiments of the present disclosure, electric charges generated due to induced light are referred to as photo-generated charges, and this applies to the following embodiments and will not be repeated.

Figure 4:
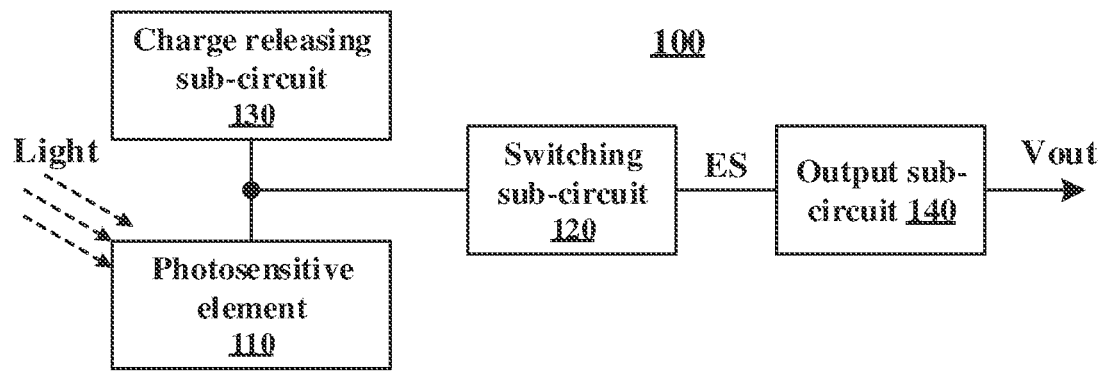
FIG. 4 is a schematic diagram of another detection circuit provided by some embodiments of the disclosure.

Some embodiments of the present disclosure also provide a detection circuit 100, as illustrated in FIG. 4. The detection circuit 100 is different from the detection circuit 100 illustrated in FIG. 3 in that it further includes an output sub-circuit 140.

For example, the output sub-circuit 140 is coupled to the switching sub-circuit 120 for receiving the electrical signal ES, and the output sub-circuit 140 is configured to process the electrical signal ES for outputting a detection signal Vout. For example, the output sub-circuit 140 can perform an integration processing on the electrical signal ES, and for example, the output sub-circuit 140 can additionally perform an amplification processing on the electrical signal ES. For example, the output sub-circuit 140 may be coupled to a processor (e.g., an integrated circuit chip) through leads, so that the detection signal Vout may be transmitted to the processor, and the processor can further process the detection signal Vout for obtaining a skin print image. The skin print image can be used to implement operations such as skin print recognition. For example, the processor may be implemented by a general-purpose processor or a special-purpose processor, for example, by a digital signal processor (DSP), and the embodiments of the present disclosure are not limited thereto.

For example, the output sub-circuit 140 may output the detection signal Vout during an output sub-period of one frame. For example, in some embodiments, the output sub-circuit 140 may also be configured to receive a reference voltage Vref. For example, during a reset sub-period of one frame, the switching sub-circuit 120 is turned on, so that the reference voltage Vref may be provided to one terminal of the photosensitive element 110, for example, to a cathode electrode of the photosensitive element 110, thereby completing the reset of the photosensitive element 110. The reset sub-period will be described below and will not be repeated here.

In the detection circuit 100 provided by some embodiments of the present disclosure, the photosensitive element 110 includes an anode electrode and a cathode electrode.

The charge releasing sub-circuit 130 is configured to cause a potential of the anode electrode of the photosensitive element 110 to be greater than or equal to a potential of the cathode electrode of the photosensitive element 110 after the switching sub-circuit 120 outputs the electrical signal ES, so that the photosensitive element 110 is switched from an off state to an on state, thereby releasing the accumulated photo-generated charges in the photosensitive element 110.

Figure 5:
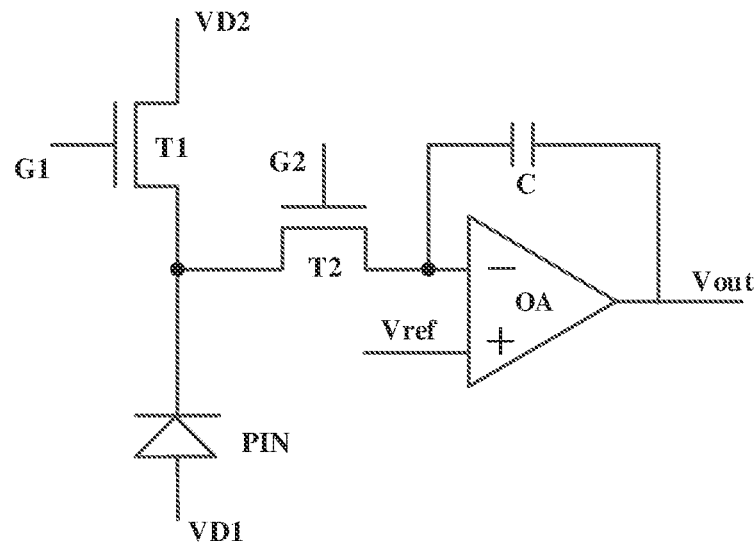
FIG. 5 is a first circuit diagram of a detection circuit provided by some embodiments of the present disclosure.

For example, in some embodiments, the detection circuit 100 illustrated in FIG. 4 may be implemented as the circuit structure in FIG. 5.

As illustrated in FIG. 5, the charge releasing sub-circuit 130 includes a first transistor T1 and the switching sub-circuit 120 includes a second transistor T2. The photosensitive element 110 adopts a PN type or PIN type photodiode. The following each embodiment is illustrated by taking that the photosensitive element 110 is a PIN type photodiode as an example. The photosensitive element 110 is denoted as PIN in the drawings and will not be repeated again.

The anode electrode of the photosensitive element PIN is configured to receive a first voltage VD1, the cathode electrode of the photosensitive element PIN is coupled to a first electrode of the first transistor T1, a gate electrode of the first transistor T1 is configured to receive a first control signal G1, and a second electrode of the first transistor T1 is configured to receive a second voltage VD2.

A gate electrode of the second transistor T2 is configured to receive a second control signal G2, a first electrode of the second transistor T2 is coupled to the cathode electrode of the photosensitive element, and a second electrode of the second transistor T2 is configured to output the electrical signal ES.

It should be noted that the transistors used in the embodiments of the present disclosure can be thin film transistors or field effect transistors or other switching devices having the same characteristics, and the embodiments of the present disclosure are all described by taking thin film transistors as examples. A source electrode and a drain electrode of a transistor used here may be symmetrical in structure, so the source electrode and the drain electrode can be structurally indistinguishable. In the embodiments of the present disclosure, in order to distinguish the two electrodes of the transistor except the gate electrode, one electrode is directly described as the first electrode and the other electrode is described as the second electrode.

In addition, the transistors in the embodiments of the present disclosure are all described by taking N-type transistors as examples. In this case, the first electrode may be a drain electrode and the second electrode may be a source electrode. It should be noted that the present disclosure includes but is not limited thereto. For example, one or more transistors in a detection circuit provided by the embodiments of the present disclosure may also adopt P-type transistors, and in this case, the first electrode may be a source electrode and the second electrode may be a drain electrode, as long as the polarities of each electrode of the selected type of transistor are corresponding to the polarities of each electrode of the respective transistor in the embodiments of the present disclosure.

For example, in an embodiment illustrated in FIG. 5, the first voltage VD1 is greater than the second voltage VD2 in a charge releasing operation. For example, the value of the first voltage VD1 is within the range from 0V to 10V, and for example, the value of the second voltage VD2 is within the range from −6V to 0V. It should be noted that the embodiments of the present disclosure do not limit the values of the first voltage VD1 and the second voltage VD2, as long as the first voltage VD1 is greater than the second voltage VD2.

Figure 6:
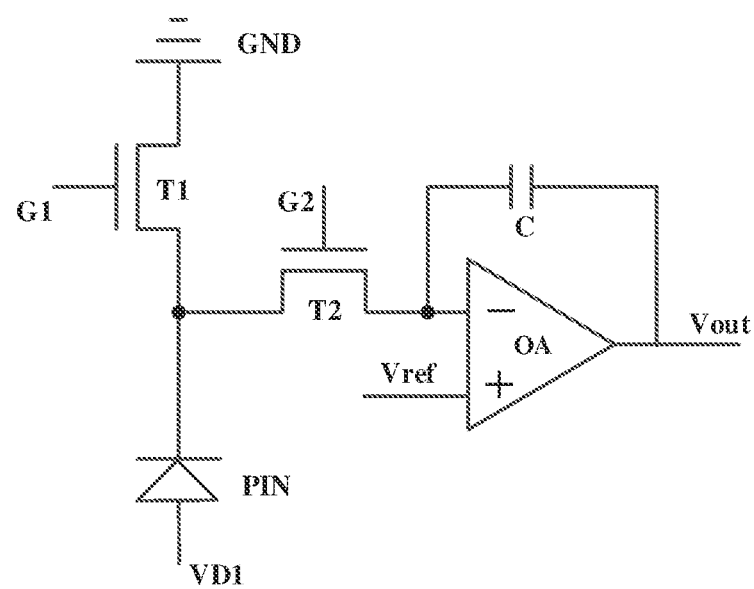
FIG. 6 is a second circuit diagram of a detection circuit provided by some embodiments of the present disclosure.

For example, in some embodiments, as illustrated in FIG. 6, the second electrode of the first transistor T1 may also be configured to be grounded, i.e., in this case, the second voltage VD2 is zero volts.

Figure 7:
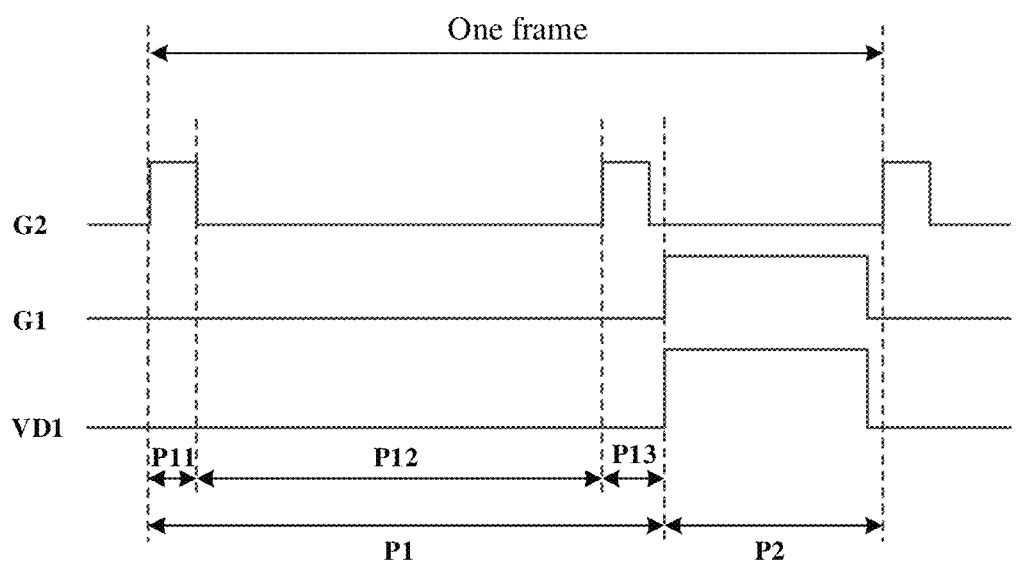
FIG. 7 is a timing chart when the detection circuit illustrated in FIG. 6 is in operate.

The embodiments illustrated in FIGS. 5 and 6 will be described below in conjunction with a timing chart of FIG. 7. As illustrated in FIG. 7, operations of each frame may be classified as a detection operation and a charge releasing operation. The detection operation may be classified as a reset sub-period P11, an optical-electrical conversion sub-period P12, and an output sub-period P13.

As illustrated in FIGS. 5 and 6, the anode electrode of the photosensitive element PIN is configured to be electrically coupled to a variable voltage terminal, and the cathode electrode is coupled to the second electrode of the first transistor T1. The variable voltage terminal is configured to output the first voltage VD1 having a high level during the charge releasing operation. At this time, the second transistor T2 is turned off and the first transistor T1 is turned on, so that the potential of the cathode electrode of the photosensitive element PIN is VD2 (as illustrated in FIG. 5) or a ground potential (as illustrated in FIG. 6). In this embodiment, the first voltage VD1 is greater than the second voltage VD2 or the ground potential, and the photosensitive element PIN is forward biased. The variable voltage terminal is also configured to output a bias voltage having a low level in the detection operation. In the detection operation, the first transistor T1 is always turned off. In the reset sub-period P11 for the detection operation, the second transistor T2 is turned on for resetting the photosensitive element PIN. Next, in the optical-electrical conversion sub-period P12, the second transistor T2 is turned off, at this time the photosensitive element PIN is reverse biased because the bias voltage has a low level. Finally, in the output sub-period P13, the second transistor T2 is turned on for transferring the photo charges converted by the photosensitive element PIN to a subsequent integration circuit, so that the subsequent circuit processing can obtain fingerprint valleys and ridges information. In this embodiment, the first voltage VD1 output from the variable voltage terminal is greater than the bias voltage. For example, the first voltage VD1 is greater than zero volts and the bias voltage is less than zero volts.

In some embodiments of the present disclosure, as illustrated in FIGS. 5 and 6, the output sub-circuit 140 includes an operational amplifier OA and a storage capacitor C. An in-phase input terminal of the operational amplifier OA is configured to receive the reference voltage Vref, and an inverting input terminal of the operational amplifier OA is configured to receive the electrical signal ES. For example, the inverting input terminal of the operational amplifier OA is coupled to the second electrode of the second transistor T2, and an output terminal of the operational amplifier OA is configured to output the detection signal Vout. A first electrode of the storage capacitor C is coupled to the inverting input terminal of the operational amplifier OA, and a second electrode of the storage capacitor C is coupled to the output terminal of the operational amplifier OA. For example, the size of the storage capacitor C is positively correlated with the dynamic range of the detection signal Vout output by the operational amplifier OA. For example, when the storage capacitor C becomes larger, the dynamic range of the detection signal Vout correspondingly becomes larger.

The operation principle of the detection circuit 100 illustrated in FIG. 6 will be described below with reference to the timing chart illustrated in FIG. 7.

For example, as illustrated in FIG. 7, one frame includes a detection period P1 and a charge releasing period P2 after the detection period P1. In the detection period P1, the photosensitive element PIN converts a received optical signal into an electrical signal ES, and the switching sub-circuit 120 outputs the electrical signal ES.

For example, in some embodiments, the detection period P1 includes a reset sub-period P11, an optical-electrical conversion sub-period P12, and an output sub-period P13.

In the reset sub-period P11, the switching sub-circuit 120 is turned on and provides the reference voltage Vref or other initialization voltage (Vint) received by the output sub-circuit 140 to the cathode electrode of the photosensitive element PIN for resetting the photosensitive element PIN. For example, in the reset sub-period P11, the second control signal G2 is at a high level, the second transistor T2 is turned on, the first control signal G1 is at a low level, and the first transistor T1 is turned off. The turned-on second transistor T2 can provide the reference voltage Vref or other initialization voltage (Vint) received by the in-phase input terminal of the operational amplifier OA to the cathode electrode of the photosensitive element PIN, thereby resetting the photosensitive element PIN. For example, when a plurality of detection circuits 100 form a detection circuit array, at the start of the detection period P1 of one frame, first, all the photosensitive elements PIN in the detection circuit array are reset so that potentials of the cathode electrodes of all the photosensitive elements PINs are set to the reference voltage Vref or other initialization voltage (Vint), so that all the photosensitive elements PINs are detected from a same reference, and the accuracy of skin print recognition can be improved. For example, in the embodiments of the present disclosure, the value of the reference voltage Vref is within the range from 1V to 1.3V.

In the optical-electrical conversion sub-period P12, the switching sub-circuit 120 is turned off, and the photosensitive element PIN is in a reverse bias state. The photosensitive element PIN generates photo-generated charges due to illumination and accumulates the photo-generated charges, and thus converts the received optical signal into the electrical signal ES. For example, in the optical-electrical conversion sub-period P12, both the first control signal G1 and the second control signal G2 are at a low level, and both the first transistor T1 and the second transistor T2 are turned off. The first voltage VD1 received by the anode electrode of the photosensitive element PIN is a bias voltage, for example, the bias voltage is smaller than the reference voltage Vref, so that the photosensitive element PIN is reverse biased. In the case where the photosensitive element PIN is reverse biased, during the optical-electrical conversion sub-period P12 of a predetermined length, the amount of the photo-generated charges accumulated by the photosensitive element PIN is linearly related to the intensity of the illuminated light, so that the electrical signal output by the photosensitive element PIN is linearly related to the received optical signal. For example, the photosensitive element PIN accumulates and converts the received optical signal into the electrical signal ES during the optical-electrical conversion sub-period P12 and outputs it.

In the output sub-period P13, the switching sub-circuit 120 is turned on, and the output sub-circuit 140 processes the electrical signal ES output by the switching sub-circuit 120 and outputs the detection signal Vout. For example, during the output sub-period P13, the second control signal G2 is at a high level, the second transistor T2 is turned on, the first control signal G1 is at a low level, and the first transistor T1 is turned off. The turned-on second transistor T2 can transmit the electrical signal ES (i.e., accumulated photo-generated charges) output by the photosensitive element PIN to the inverting input terminal of the operational amplifier OA, and then the operational amplifier OA can process the electrical signal ES for outputting the detection signal Vout.

It should be noted that in the detection period P1 of the frame described above, the first voltage VD1 received by the anode electrode of the photosensitive element PIN is a bias voltage, and the bias voltage causes the photosensitive element PIN to be reverse biased, for example, the bias voltage is less than zero volts.

Next, in the charge releasing period P2, the charge releasing sub-circuit 130 releases the charges in the photosensitive element PIN after the electrical signal ES is output. For example, in some embodiments, the charge releasing sub-circuit 130 causes the potential of the anode electrode of the photosensitive element PIN to be greater than or equal to the potential of the cathode electrode of the photosensitive element PIN after the electrical signal ES is output, so that the photosensitive element PIN is converted from the reverse bias state to the forward bias state, and becomes turned-on itself, thereby releasing the photo-generated charges remaining in the photosensitive element PIN.

For example, in the charge releasing period P2, the first control signal G1 is at a high level, the first transistor T1 is turned on, the second control signal G2 is at a low level, and the second transistor T2 is turned off. The first voltage VD1 received by the anode electrode of the photosensitive element PIN changes from low-level to high-level, for example, the high level is greater than zero volts and greater than the second voltage VD2, and the cathode electrode receives the second voltage VD2 (as illustrated in FIG. 5) or the ground voltage (as illustrated in FIG. 6), so that the photosensitive element PIN changes from reverse biased to forward biased, thereby forming a current path between the anode electrode of the photosensitive element PIN and the ground (GND) (as illustrated in FIG. 6), and thus the photo-generated charges remaining in the photosensitive element PIN can be quickly conducted away, that is, the charges remaining in the photosensitive element PIN without being transferred away during the detection period P1 can be released, so that the afterimage problem can be avoided, and further the accuracy of skin print recognition by the skin print recognition device adopting the detection circuit can be improved.

Figure 8:
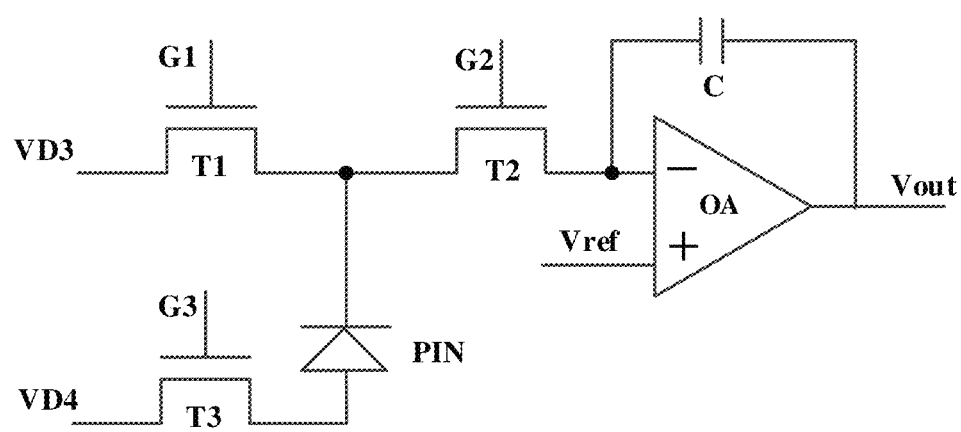
FIG. 8 is a third circuit diagram of a detection circuit provided by some embodiments of the present disclosure.

Some embodiments of the present disclosure also provide a detection circuit. As illustrated in FIG. 8, the charge releasing sub-circuit 130 includes a first transistor T1 and a third transistor T3. Only portions different from the detection circuit illustrated in FIG. 6 will be described below.

A gate electrode of the first transistor T1 is configured to receive a first control signal G1, a first electrode of the first transistor T1 is configured to receive a third voltage VD3, and a second electrode of the first transistor T1 is coupled to the cathode electrode of the photosensitive element PIN.

A gate electrode of the third transistor T3 is configured to receive a third control signal G3, a first electrode of the third transistor T3 is configured to receive a fourth voltage VD4, and a second electrode of the third transistor T3 is coupled to the anode electrode of the photosensitive element PIN.

For example, the fourth voltage VD4 is greater than or equal to the third voltage VD3.

The operation principle of the detection circuit 100 illustrated in FIG. 8 will be described below with reference to the timing chart illustrated in FIG. 9.

Figure 9:
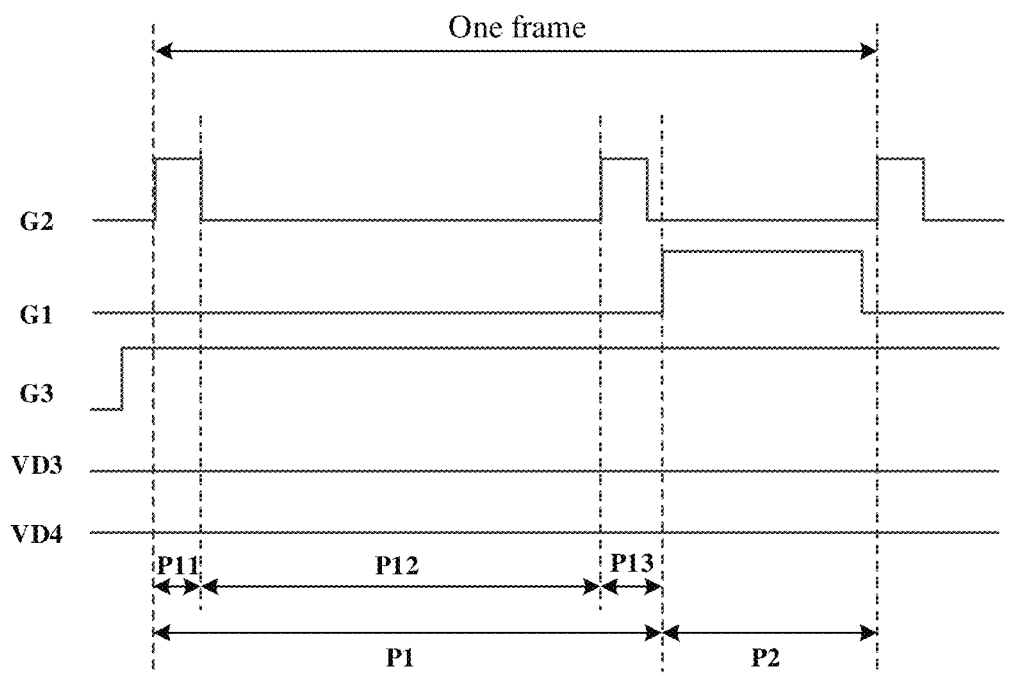
FIG. 9 is a timing chart when the detection circuit illustrated in FIG. 8 is in operate.

For example, as illustrated in FIG. 9, one frame includes a detection period P1 and a charge releasing period P2 after the detection period P1. In the detection period P1, the photosensitive element PIN converts a received optical signal into an electrical signal ES, and the switching sub-circuit 120 outputs the electrical signal ES. The detailed description for the detection period P1 can refer to the respective description in the corresponding embodiments of FIG. 7, and will not be repeated here.

As illustrated in FIG. 9, for example, at least in the charge releasing operation, the third voltage VD3 received by the first transistor T1 and the fourth voltage VD4 received by the third transistor T3 are both constant voltages. The third control signal G3 received by the third transistor T3 is at a high level during both the detection period P1 and the charge releasing period P2, that is, the third transistor T3 remains turned-on. As another example, in the detection operation, the third transistor T3 may receive a bias voltage different from the fourth voltage VD4 so that the photosensitive element PIN is reverse biased.

As illustrated in FIG. 9, in the charge releasing period P2 of one frame, the first control signal G1 is at a high level, the first transistor T1 is turned on, the second control signal G2 is at a low level, and the second transistor T2 is turned off. The third control signal G3 is at a high level, and the third transistor T3 is normally-on. The turned-on first transistor T1 transmits the received third voltage VD3 to the cathode electrode of the photosensitive element PIN, and the turned-on third transistor T3 transmits the received fourth voltage VD4 to the anode electrode of the photosensitive element PIN.

For example, when the fourth voltage VD4 is greater than the third voltage VD3, the photosensitive element PIN is converted from the reverse bias state to the forward bias state, so that a current path between the anode electrode and cathode electrode of the photosensitive element PIN is formed, and the charges remaining in the photosensitive element PIN can be quickly conducted away. For another example, when the fourth voltage VD4 is equal to the third voltage VD3, it is equivalent to electrically coupling the anode electrode and cathode electrode of the photosensitive element PIN to a same voltage, thereby releasing the charges in the photosensitive element PIN. At this time, the resistance value of the turned-on first transistor T1 and the turned-on third transistor T3 which are in series is taken as the resistance value for releasing photo charges. In one example, the first transistor T1 and the third transistor T3 that are turned on are both large resistors, for example, large resistors at a megaohm level, so that the defects caused by excessive current for releasing photo charges can be avoided. As illustrated in FIG. 8, the charges in the photosensitive element PIN can be released either by causing the photosensitive element PIN to be forward biased or by causing the potentials of the cathode electrode and anode electrode of the photosensitive element PIN to be the same, so that the afterimage problem can be avoided, and further the accuracy of skin print recognition by the skin print recognition device adopting the detection circuit can be improved.

In the detection circuit 100 provided by some embodiments of the present disclosure, the photosensitive element 110 includes an anode electrode and a cathode electrode, and the charge releasing sub-circuit 130 is configured to electrically couple the anode electrode of the photosensitive element 110 to the cathode electrode of the photosensitive element 110 after the switching sub-circuit 120 outputs the electrical signal ES, so as to release the charges in the photosensitive element 110.

Figure 10:
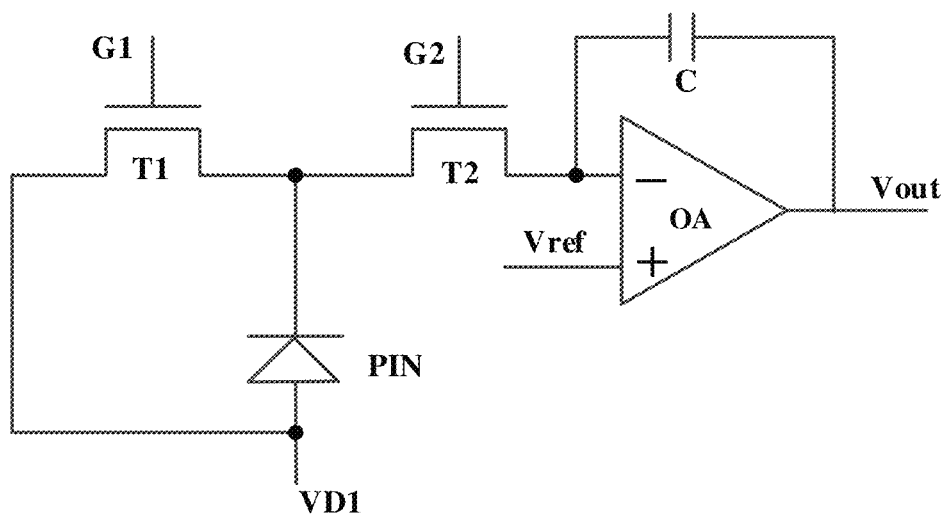
FIG. 10 is a fourth circuit diagram of a detection circuit provided by some embodiments of the present disclosure.

Some embodiments of the present disclosure also provide a detection circuit 100. As illustrated in FIG. 10, the charge releasing sub-circuit 130 includes a first transistor T1. Only portions different from the detection circuit illustrated in FIG. 6 will be described below.

A first electrode of the first transistor T1 is coupled to the anode electrode of the photosensitive element PIN, a gate electrode of the first transistor T1 is configured to receive a first control signal G1, and a second electrode of the first transistor T1 is coupled to the cathode electrode of the photosensitive element PIN.

For example, as illustrated in FIG. 10, the anode electrode of the photosensitive element PIN is configured to receive a first voltage VD1 that is always at a low level, for example, and the first voltage VD1 is less than zero volts. In the case where the first transistor T1 is turned on, potentials of the anode electrode and cathode electrode of the photosensitive element PIN respectively coupled to the first electrode and the second electrode of the first transistor are caused to be the same. In the case where the first transistor T1 is turned off, the first voltage at a low level causes the photosensitive element PIN to be reverse biased.

The operation principle of the detection circuit 100 illustrated in FIG. 10 will be described below with reference to the timing chart illustrated in FIG. 11.

Figure 11:
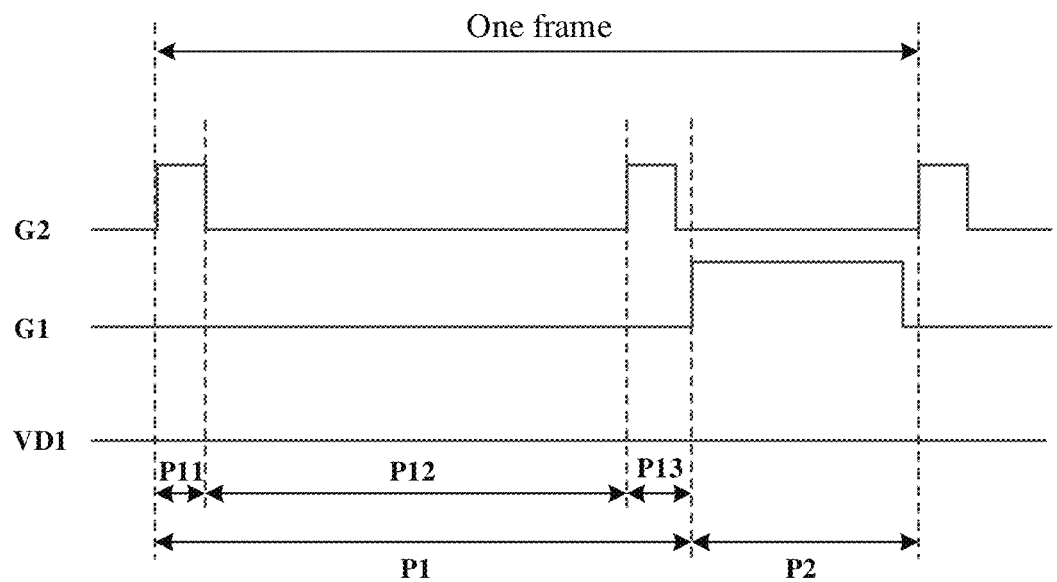
FIG. 11 is a timing chart when the detection circuit illustrated in FIG. 10 is in operate.

For example, as illustrated in FIG. 11, one frame includes a detection period P1 and a charge releasing period P2 after the detection period P1. During the detection period P1, the photosensitive element PIN converts a received optical signal into an electrical signal ES, and the switching sub-circuit 120 outputs the electrical signal ES. During this period, the first control signal G1 is at a low level and the first transistor T1 is turned off. The detailed description for the detection period P1 can refer to the respective description in the corresponding embodiments of FIG. 7 and will not be repeated here.

During the charge releasing period P2, that is, after the electric signal ES is output by the charge releasing sub-circuit 130, the first control signal G1 changes from low-level to high-level, and the first transistor T1 is turned on, so that the anode electrode and cathode electrode of the photosensitive element PIN are electrically coupled, thereby releasing the charges in the photosensitive element PIN.

As illustrated in FIG. 11, during the charge releasing period P2 of one frame, the first control signal G1 is at a high level, the first transistor T1 is turned on, the second control signal G2 is at a low level, and the second transistor T2 is turned off. The turned-on first transistor T1 is approximately equivalent to a large resistor at a mega level, through which the anode electrode and cathode electrode of the photosensitive element PIN are electrically coupled, so that the photo generated charges accumulated on the anode electrode and cathode electrode of the photosensitive element PIN can be neutralized with each other, and thus the charges in the photosensitive element PIN can be quickly released. Because the anode electrode and cathode electrode of the photosensitive element PIN are coupled through the large resistor, the defects caused by excessive current can be avoided, so that the afterimage problem can be avoided and further the accuracy of skin print recognition by the skin print recognition device adopting the detection circuit can be improved.

It should be noted that in the embodiments illustrated in FIGS. 10 and 11, the first voltage VD1 keeps constant, for example, the first voltage VD1 is less than zero volts, so that the photosensitive diode PIN is reverse biased, i.e., the photosensitive diode maintains a reverse bias characteristic. Compared to the embodiments corresponding to FIG. 7, the first voltage VD1 adopted in the embodiments corresponding to FIG. 11 only needs to keep constant, so it is not necessary to control the first voltage VD1 to change between high-level and low-level, thereby reducing power consumption.

In addition, the electrical connection in the embodiments of the present disclosure includes direct connection through wires as well as connection through conductive transistors, and the embodiments of the present disclosure are not limited thereto.

Figure 12:
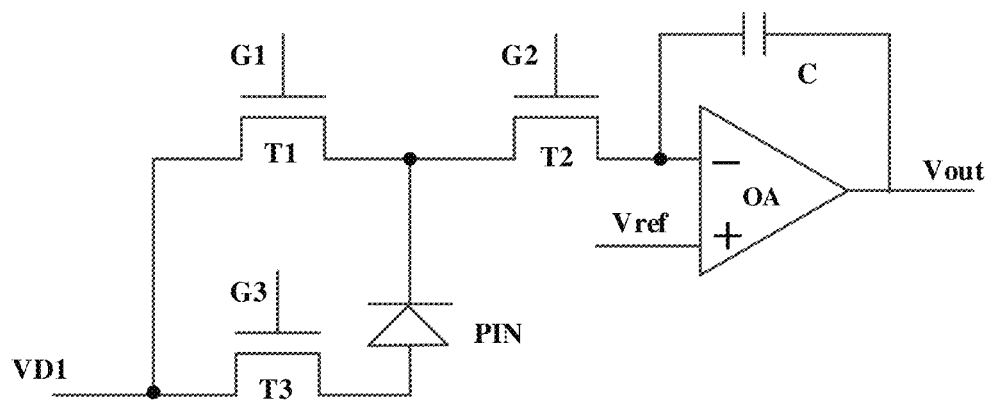
FIG. 12 is a fifth circuit diagram of a detection circuit provided by some embodiments of the present disclosure.

Some embodiments of the present disclosure also provide a detection circuit 100. As illustrated in FIG. 12, the charge releasing sub-circuit 130 includes a first transistor T1 and a third transistor T3. Only portions different from the detection circuit illustrated in FIG. 6 will be described below.

A gate electrode of the first transistor T1 is configured to receive a first control signal G1, a first electrode of the first transistor T1 is coupled to a first electrode of the third transistor T3, and a second electrode of the first transistor T1 is coupled to the cathode electrode of the photosensitive element PIN. A gate electrode of the third transistor T3 is configured to receive a third control signal G3, and a second electrode of the third transistor T3 is coupled to the anode electrode of the photosensitive element PIN.

For example, as illustrated in FIG. 12, the first electrode of the third transistor T3 is configured to receive a first voltage VD1, for example, the first voltage VD1 is less than zero volts so that the photosensitive element PIN is reverse biased.

Figure 13:
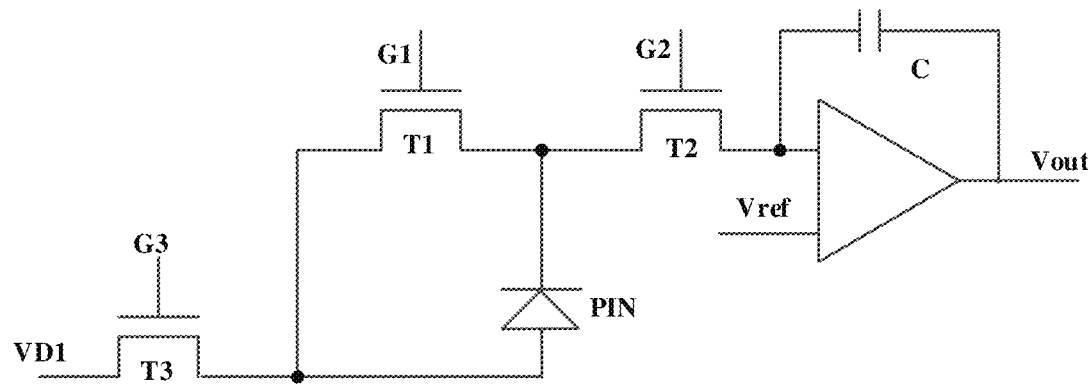
FIG. 13 is a sixth circuit diagram of a detection circuit provided by some embodiments of the present disclosure.

Some embodiments of the present disclosure also provide a detection circuit 100. As illustrated in FIG. 13, the charge releasing sub-circuit 130 includes a first transistor T1 and a third transistor T3. Only portions different from the detection circuit illustrated in FIG. 6 will be described below.

A gate electrode of the first transistor T1 is configured to receive a first control signal G1, a first electrode of the first transistor T1 is coupled to the anode electrode of the photosensitive element PIN, and a second electrode of the first transistor T1 is coupled to the cathode electrode of the photosensitive element PIN. A gate electrode of the third transistor T3 is configured to receive a third control signal G3, a first electrode of the third transistor T3 is configured to receive a first voltage VD1, and a second electrode of the third transistor T3 is coupled to the anode electrode of the photosensitive element PIN.

For example, the first voltage VD1 is less than zero volts so that the photosensitive element PIN is reverse biased.

The operation principle of the detection circuit 100 illustrated in FIGS. 12 and 13 will be described below with reference to the timing chart illustrated in FIG. 14.

Figure 14:
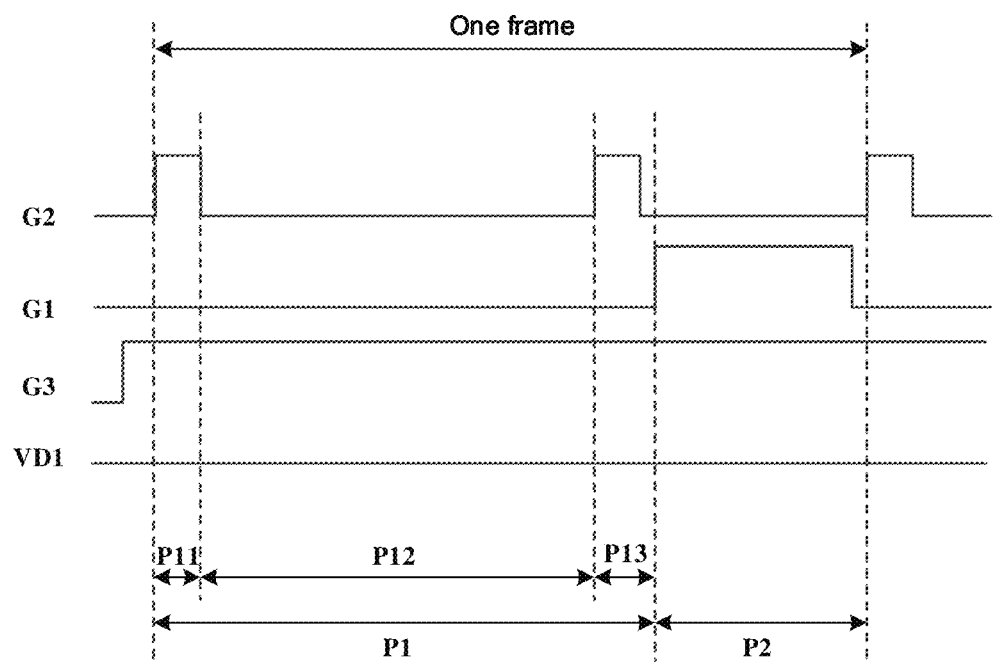
FIG. 14 is a timing chart when the detection circuit illustrated in FIGS. 12 and 13 is in operate.

For example, as illustrated in FIG. 14, one frame includes a detection period P1 and a charge releasing period P2 following the detection period P1. During the detection period P1, the photosensitive element PIN converts a received optical signal into an electrical signal ES, and the switching sub-circuit 120 outputs the electrical signal ES. As to the detailed description of the detection period P1, reference may be made to the respective description in the corresponding embodiments of FIG. 7, and will not be repeated here.

In the charge releasing period P2, the charge releasing sub-circuit 130 electrically couples the anode electrode and cathode electrode of the photosensitive element PIN after the electrical signal ES is output, so as to release the charges in the photosensitive element PIN.

As illustrated in FIG. 14, the first voltage VD1 is a constant voltage. The third control signal G3 received by the third transistor T3 is at a high level in both the detection period P1 and the charge releasing period P2, that is, the third transistor T3 remains turned-on.

For example, in the charge releasing period P2, the first control signal G1 is at a high level, the first transistor T1 is turned on, the second control signal G2 is at a low level, and the second transistor T2 is turned off. For the detection circuit illustrated in FIG. 12, the turned-on first transistor T1 and the turned-on third transistor T3 cause the anode electrode and cathode electrode of the photosensitive element PIN to be electrically coupled. For the detection circuit illustrated in FIG. 13, the turned-on first transistor T1 causes the anode electrode and cathode electrode of the photosensitive element PIN to be electrically coupled, so that the charges in the photosensitive element PIN can be quickly released through the turned-on first transistor T1 (equivalent to a large resistor), and thus the afterimage problem can be avoided, also, the excessive current can be avoided, and further the accuracy of skin print recognition by the skin print recognition device adopting the detection circuit can be improved.

In the detection circuit illustrated in FIG. 12, the resistance value of the path through which the photosensitive element PIN releases the charges is the resistance value of the first transistor T1 and the third transistor T3 which are coupled in series. Compared to other embodiments, the detection circuit can reduce the current generated when the charges in the photosensitive element PIN are released, thereby preventing the detection circuit from being damaged by larger current.

It should be noted that, for example, the first transistor T1, the second transistor T2, the third transistor T3, and the photosensitive element PIN in the detection circuit 100 provided by the embodiments of the present disclosure may be directly provided in a display panel, while, for example, the operational amplifier OA and the storage capacitor C may be provided in an external circuit electrically coupled to the display panel.

Figure 15:
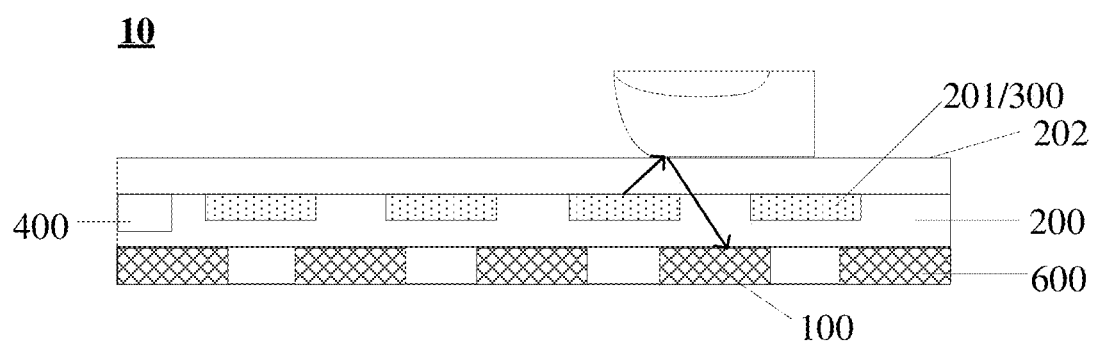
FIG. 15 is a schematic diagram of a skin print recognition device provided by some embodiments of the present disclosure.

Some embodiments of the present disclosure also provide a skin print recognition device 10. As illustrated in FIG. 15, the skin print recognition device 10 has a touch side 202 (illustrated as an upper side of the skin print recognition device 10 in FIG. 15), and the skin print recognition device includes a light source array. For example, the skin print recognition device 10 can be used for the acquisition of a skin print (e.g., a fingerprint or a palm print) for fingerprint or palm print recognition. The light source array includes a plurality of light sources 300 arranged in an array within a predetermined region. The detection circuit array 600 is provided on a side of the light source array, for example, on a side of the light source array away from the touch side. The detection circuit array 600 includes a plurality of detection circuits 100 arranged in an array within a predetermined region.

In the embodiments described above, the detection circuit array 600 is provided on the side of the light source array away from the touch side. For example, in other embodiments, the detection circuit array 600 may be arranged on the same layer as the light source array, for example, a plurality of detection circuits 100 included in the detection circuit array 600 are arranged at intervals on the same layer as the light sources 300. As another example, the light source array may be provided on a side of the detection circuit array 600 away from the touch side. In such a situation, the light emitted from the light sources 300 may be emitted through the gaps between adjacent detection circuits 100 and reflected, by a skin print, to the detection circuits 100. The embodiments of the present disclosure do not specifically limit the arrangements of the detection circuit array 600 and the light source array, as long as it can be implemented that the plurality of detection circuits 100 can receive light emitted from the light sources 300 and reflected to the detection circuits 100 by a skin print for skin print acquisition.

For example, in some embodiments, the skin print recognition device 10 is, for example, a display screen having an under-screen fingerprint recognition function, and accordingly includes a display panel 200. The display panel 200 includes a pixel unit array and the pixel unit array includes a plurality of pixel units 201. For example, the pixel unit array of the display panel 200 is implemented as a light source array, and the plurality of pixel units 201 are implemented as a plurality of light sources 300. That is, the pixel units 201 of the display panel 200 are multiplexed as the light sources 300, so that the compact level of the device can be improved and the arrangement difficulty of each functional structure can be reduced. For example, the pixel units 201 in the entire display region of the display panel 200 can be controlled to be multiplexed as the light sources 300, and the detection circuit array 600 can be correspondingly arranged under the entire display region, thereby realizing full screen skin print recognition.

In other embodiments, the display screen having an under-screen skin print recognition function includes a display panel 200 and separately provided light emitting elements as light sources for realizing skin print recognition. These light emitting elements are provided, for example, between adjacent pixel units in the pixel unit array or overlapping with the pixel units.

For example, in some embodiments, the display panel 200 may be an organic light emitting diode (OLED) display panel, a quantum dot light emitting diode (QLED) display panel, or the like, and the embodiments of the present disclosure are not limited thereto. The OLED display panel may be, for example, a flexible OLED display panel. The OLED display panel has a self-luminous characteristic, and the light emission of its display pixel units can also be controlled or modulated as required, thus providing convenience for skin print acquisition, and helping to improve the integration of the device.

For example, in addition to the pixel unit array, the display panel 200 includes, signal lines (including gate lines, data lines, detection lines, etc.) for providing electrical signals (including scanning signals, data signals, detection signals, etc.). Each pixel unit 201 in the pixel unit array includes, for example, three subpixels, i.e., a red subpixel, a green subpixel, and a blue subpixel, and each subpixel includes a light emitting device (e.g., an OLED device) and a pixel driving circuit (e.g., including thin film transistors, capacitors, etc.) for driving the light emitting device (the OLED device) to emit light, etc. For example, the light emitting state of the light emitting device can be controlled by the driving circuit so as to realize the lighting of the pixel units.

For example, the detection circuit array 600 is directly manufactured on a side of the display panel 200 or inside the display panel 200 through a semiconductor process, or may be separately manufactured as a detection chip and then mounted on a side of the display panel 200. The embodiments of the present disclosure are not limited to the specific position of the detection circuit array 600.

For example, the detection circuit 100 in the detection circuit array 600 may be coupled to a processor (e.g., an integrated circuit chip) by leads, so that the detection signal Vout may be transmitted to the processor, and the processor can further process the detection signal Vout for implementing operations such as skin print recognition. For example, the processor may be implemented by a general-purpose processor or a special-purpose processor, such as a digital signal processor (DSP), and the embodiments of the present disclosure are not limited thereto.

As illustrated in FIG. 15, the skin print recognition device 10 may additionally include a controller 400. For example, the controller 400 is coupled to the light source array and configured to control the light source array to turn on or off. For example, the light source array can be controlled to switch between different light source pictures. For example, in the case where the pixel units 201 in the display panel 200 are multiplexed as the light sources 300, the controller 400 is coupled to the pixel unit array, so that the pixel unit array can be controlled to emit light.

For example, the controller 400 may be various types of integrated circuit chips having processing functions, which may have various computing architectures, such as a complex instruction set computer (CISC) architecture, a reduced instruction set computer (RISC) architecture, or an architecture that implements a combination of multiple instruction sets. In some embodiments, the controller 230 may be a microprocessor, such as an X86 processor or an ARM processor, or may be a digital processor (DSP) or the like.

For example, in some embodiments, the controller 400 may further include a memory, and the memory is used to store a control program for lighting a plurality of light sources to form a certain pattern, a control program for lighting a plurality of light sources in different regions in a time-sharing manner, and the like. For example, the memory may be any form of storage medium, such as a volatile memory or nonvolatile memory, such as a semiconductor memory or magnetic medium memory, and the embodiments of the present disclosure are not limited thereto.

The skin print recognition device 10 provided by the embodiments of the present disclosure can release the charges remaining in the photosensitive element in the last period of one frame, for example, in the charge releasing period, thereby avoiding the afterimage problem and further improving the accuracy of skin print recognition.

Some embodiments of the present disclosure also provide a driving method that can be used to drive any of the detection circuits 100 provided by the embodiments of the present disclosure. The driving method includes a detection period P1 and a charge releasing period P2 after the detection period.

In the detection period P1, the photosensitive element PIN converts the received optical signal into the electrical signal ES, and the switching sub-circuit 120 outputs the electrical signal ES.

In the charge releasing period P2, the charge releasing sub-circuit 130 releases the charges in the photosensitive element PIN after the electrical signal ES is output.

In the method provided by some embodiments of the present disclosure, in the case where the detection circuit 100 includes the output sub-circuit 140, the detection period P1 includes a reset sub-period P11, an optical-electrical conversion sub-period P12, and an output sub-period P13.

In the reset sub-period P11, the switching sub-circuit 120 is turned on and a reference voltage Vref received by the output sub-circuit 140 is provided to the cathode electrode of the photosensitive element PIN for resetting the photosensitive element PIN.

In the optical-electrical conversion sub-period P12, the switching sub-circuit 120 is turned off, and the photosensitive element PIN converts the received optical signal into the electrical signal ES.

In the output sub-period P13, the switching sub-circuit 120 is turned on, and the output sub-circuit 140 processes the electrical signal ES output by the switching sub-circuit 120 and outputs the detection signal Vout.

Some embodiments of the present disclosure also provide a method for driving a detection circuit, for example, the method can be used for the detections circuits 100 illustrated in FIGS. 5, 6 and 8. The method includes a detection period P1 and a charge releasing period P2 after the detection period P1.

In the detection period P1, the photosensitive element PIN converts the received optical signal into the electrical signal ES, and the switching sub-circuit 120 outputs the electrical signal ES.

In the charge releasing period P2, the charge releasing sub-circuit 130 causes the potential of the anode electrode of the photosensitive element PIN to be greater than or equal to the potential of the cathode electrode of the photosensitive element PIN after the electrical signal ES is output, so as to release the charges in the photosensitive element PIN.

Some embodiments of the present disclosure also provide a method for driving a detection circuit, for example, the method may be applied to the detection circuits 100 illustrated in FIGS. 10, 12, and 13. The method includes a detection period P1 and a charge releasing period P2 after the detection period P1.

In the detection period P1, the photosensitive element PIN converts the received optical signal into the electrical signal ES, and the switching sub-circuit 120 outputs the electrical signal ES.

In the charge releasing period P2, the charge releasing sub-circuit 130 electrically couples the anode electrode of the photosensitive element PIN to the cathode electrode of the photosensitive element PIN after the electrical signal ES is output, so as to release the charges in the photosensitive element PIN.

It should be noted that the detailed description and technical effects of the method provided by the embodiments of the present disclosure can refer to the description for the operation principle of the detection circuit 100 in the embodiments of the present disclosure, which is not repeated here.

What are described above is only specific implementations of the present disclosure, but the scope of the present disclosure is not limited thereto, and the scope of the present disclosure is defined by the accompanying claims.

What is claimed is:

1. A detection circuit, comprising a photosensitive element, a switching sub-circuit, and a charge releasing sub-circuit, wherein:
   the photosensitive element comprises an anode electrode and a cathode electrode, and is electrically coupled to the switching sub-circuit and the charge releasing sub-circuit and is configured to convert a received optical signal into an electrical signal;
   the switching sub-circuit is configured to output the electrical signal; and the charge releasing sub-circuit is configured to cause a potential of the anode electrode of the photosensitive element to be greater than or equal to a potential of the cathode electrode after the switching sub-circuit outputs the electrical signal, so as to release the charges in the photosensitive element;

the charge releasing sub-circuit comprises a first transistor and the switching sub-circuit comprises a second transistor, the anode electrode of the photosensitive element is configured to receive a first voltage, the cathode electrode is coupled to a first electrode of the first transistor, a gate electrode of the first transistor is configured to receive a first control signal, and a second electrode of the first transistor is configured to receive a second voltage, a gate electrode of the second transistor is configured to receive a second control signal, a first electrode of the second transistor is directly electrically connected to the cathode electrode of the photosensitive element, and a second electrode of the second transistor is configured to output the electrical signal, and the first voltage is greater than the second voltage.

2. The detection circuit of claim 1, wherein the anode electrode of the photosensitive element is configured to be electrically coupled to a variable voltage terminal, the variable voltage terminal is configured to output the first voltage in a charge releasing operation so that the photosensitive element is forward biased and to output a bias voltage in a detection operation so that the photosensitive element is reverse biased, and the bias voltage is smaller than the first voltage.

3. The detection circuit of to claim 1, wherein the charge releasing sub-circuit further comprises a third transistor, a gate electrode of the third transistor is configured to receive a third control signal, a first electrode of the third transistor is configured to receive a third voltage, and a second electrode of the third transistor is coupled to the anode electrode of the photosensitive element, and the third voltage is greater than or equal to the second voltage.

4. The detection circuit of claim 1, further comprising an output sub-circuit, wherein the output sub-circuit is coupled to the switching sub-circuit for receiving the electrical signal, and the output sub-circuit is configured to process the electrical signal for outputting a detection signal.

5. The detection circuit of claim 4, wherein the output sub-circuit comprises an operational amplifier and a storage capacitor, an in-phase input terminal of the operational amplifier is configured to receive a reference voltage, an inverting input terminal of the operational amplifier is configured to receive the electrical signal, and an output terminal of the operational amplifier is configured to output the detection signal; and a first electrode of the storage capacitor is coupled to the inverting input terminal of the operational amplifier, and a second electrode of the storage capacitor is coupled to the output terminal of the operational amplifier.

6. A skin print recognition device, comprising a display panel and a plurality of detection circuits of claim 1 provided on a side of the display panel, wherein the display panel comprises a plurality of pixel units, and the detection circuit is configured to receive light emitted by the plurality of pixel units and reflected by a skin-print that touches the display panel.

7. A detection circuit, comprising a photosensitive element, a switching sub-circuit, and a charge releasing sub-circuit, wherein:

the photosensitive element comprises an anode electrode and a cathode electrode, and is electrically coupled to the switching sub-circuit and the charge releasing sub-circuit and is configured to convert a received optical signal into an electrical signal;

the switching sub-circuit is configured to output the electrical signal; and the charge releasing sub-circuit is configured to electrically couple the anode electrode to the cathode electrode after the switching sub-circuit outputs the electrical signal, so as to release the charges in the photosensitive element.

8. The detection circuit of claim 7, wherein the charge releasing sub-circuit comprises a first transistor and the switching sub-circuit comprises a second transistor;

a first electrode of the first transistor is coupled to the anode electrode of the photosensitive element, a gate electrode of the first transistor is configured to receive a first control signal, and a second electrode of the first transistor is coupled to the cathode electrode of the photosensitive element, and a gate electrode of the second transistor is configured to receive a second control signal, a first electrode of the second transistor is coupled to the cathode electrode of the photosensitive element, and a second electrode of the second transistor is configured to output the electrical signal.

9. The detection circuit of claim 8, wherein the anode electrode of the photosensitive element is configured to receive a first voltage, and the first voltage is at a low level, so that the photosensitive element is reverse biased in a case where the first transistor is turned off.

10. The detection circuit of claim 7, wherein the charge releasing sub-circuit comprises a first transistor and a third transistor, and the switching sub-circuit comprises a second transistor;

a gate electrode of the first transistor is configured to receive a first control signal, a first electrode of the first transistor is coupled to a first electrode of the third transistor, and a second electrode of the first transistor is coupled to the cathode electrode of the photosensitive element, a gate electrode of the third transistor is configured to receive a third control signal, and a second electrode of the third transistor is coupled to the anode electrode of the photosensitive element, and a gate electrode of the second transistor is configured to receive a second control signal, a first electrode of the second transistor is coupled to the cathode electrode of the photosensitive element, and a second electrode of the second transistor is configured to output the electrical signal.

11. The detection circuit of claim 7, wherein the charge releasing sub-circuit comprises a first transistor and a third transistor, and the switching sub-circuit comprises a second transistor;

a gate electrode of the first transistor is configured to receive a first control signal, a first electrode of the first transistor is coupled to the anode electrode of the photosensitive element, and a second electrode of the first transistor is coupled to the cathode electrode of the photosensitive element, a gate electrode of the third transistor is configured to receive a third control signal, a first electrode of the third transistor is configured to receive a first voltage, and a second electrode of the third transistor is coupled to the anode electrode of the photosensitive element, a gate electrode of the second transistor is configured to receive a second control signal, a first electrode of the second transistor is coupled to the cathode electrode of the photosensitive element, and a second electrode of the second transistor is configured to output the electrical signal, and the first voltage is less than zero volts.

12. A method for driving the detection circuit of claim 7, comprising a detection period and a charge releasing period after the detection period, wherein, in the detection period, the photosensitive element converts the received optical signal into the electrical signal, and the switching sub-circuit outputs the electrical signal; and in the charge releasing period, the charge releasing sub-circuit electrically couples the anode electrode to the cathode electrode after the electrical signal is output, so as to release the charges in the photosensitive element.

13. A method for driving the detection circuit, the detection circuit comprising a photosensitive element, a switching sub-circuit, and a charge releasing sub-circuit, wherein the photosensitive element is electrically coupled to the switching sub-circuit and the charge releasing sub-circuit and is configured to convert a received optical signal into an electrical signal; the switching sub-circuit is configured to output the electrical signal; and the charge releasing sub-circuit is configured to release charges in the photosensitive element after the switching sub-circuit outputs the electrical signal, the method comprising a detection period and a charge releasing period after the detection period, wherein in the detection period, the photosensitive element converts the received optical signal into the electrical signal, and the switching sub-circuit outputs the electrical signal; and in the charge releasing period, the charge releasing sub-circuit releases the charges in the photosensitive element after the electrical signal is output, and wherein the detection period comprises a reset sub-period, an optical-electrical conversion sub-period and an output sub-period, in the reset sub-period, the switching sub-circuit is turned on, and a reference voltage received by an output sub-circuit is provided to a cathode electrode of the photosensitive element for resetting the photosensitive element;

in the optical-electrical conversion sub-period, the switching sub-circuit is turned off, and the photosensitive element converts the received optical signal into the electrical signal; and in the output sub-period, the switching sub-circuit is turned on and outputs the electrical signal.

14. A method for driving the detection circuit of claim 13, wherein, in the charge releasing period, the charge releasing sub-circuit causes the potential of the anode electrode to be greater than or equal to the potential of the cathode electrode after the electrical signal is output, so as to release the charges in the photosensitive element.

\* \* \* \* \*